United States Patent
Huang et al.

(10) Patent No.: US 6,541,736 B1
(45) Date of Patent: Apr. 1, 2003

(54) CIRCUIT BOARD/PRINTED CIRCUIT BOARD HAVING PRE-RESERVED CONDUCTIVE HEATING CIRCUITS

(75) Inventors: Chiu Fong Huang, Panchiao (TW); Chung-Shan Chen, Kaohsiung (TW)

(73) Assignee: Usun Technology Co., Ltd., Taoyuan (TW)

( * ) Notice: Subject to any disclaimer, the term of this patent is extended or adjusted under 35 U.S.C. 154(b) by 0 days.

(21) Appl. No.: 10/006,145

(22) Filed: Dec. 10, 2001

(51) Int. Cl.⁷ .................................................. H05B 3/22
(52) U.S. Cl. ...................................... 219/209; 219/543
(58) Field of Search ................................ 219/209, 543, 219/535, 469, 501; 29/620, 830, 843, 846, 852, 879; 174/84 R, 88 R, 94 R, 254, 259, 262; 228/180.1, 180.22; 361/782, 751, 760, 748; 156/52, 253; 338/307, 308, 309

(56) References Cited

U.S. PATENT DOCUMENTS

| | | | | |
|---|---|---|---|---|
| 3,320,658 A | * | 5/1967 | Bolda et al. .................. 29/879 |
| 4,800,461 A | * | 1/1989 | Dixon et al. ................. 174/254 |
| 5,502,889 A | * | 4/1996 | Casson et al. ................. 29/830 |
| 5,859,407 A | * | 1/1999 | Saiki et al. .................. 219/209 |
| 5,896,259 A | * | 4/1999 | Farwell et al. ............... 219/209 |
| 6,396,706 B1 | * | 5/2002 | Wohlfarth .................... 361/760 |

* cited by examiner

*Primary Examiner*—Tu Ba Hoang
(74) *Attorney, Agent, or Firm*—Rosenberg, Klein & Lee

(57) ABSTRACT

The present invention provides a circuit board/printed circuit board having pre-reserved conductive heating circuits, which comprises a plurality of metal circuit substrates and a plurality of layers of insulating material. The conductive heating circuits are disposed on the metal circuit substrates. Each of the conductive heating circuits has a plurality of direct heat-generating regions. The insulating material is disposed between the metal circuit substrates. When a current is provided to the conductive heating circuits, heat required for partly bonding and hardening can be generated so that the insulating material and the corresponding positions of the direct heat-generating regions on the metal circuit substrates can be bonded and hardened together. A pre-stacked multi-layer metal circuit board with partly bonding and hardening is thus finished.

8 Claims, 6 Drawing Sheets

US 6,541,736 B1

CIRCUIT BOARD/PRINTED CIRCUIT BOARD HAVING PRE-RESERVED CONDUCTIVE HEATING CIRCUITS

FIELD OF THE INVENTION

The present invention relates to a circuit board/printed circuit board having pre-reserved conductive heating circuits and, more particularly, to a multi-layer circuit board/printed circuit, wherein a metal substrate having pre-reserved conductive heating circuit can generate heat quickly, directly and uniformly at the demanded position to get high quality of bonding strength and hardening.

BACKGROUND OF THE INVENTION

FIGS. 1 and 1A show the conventional manufacturing way of pre-stacked multi-layer metal circuit boards by rivet, wherein a plurality of metal circuit substrates 10a and a plurality of layers of insulating material 11a are pre-stacked and riveted and positioned with rivets 20a. In addition to wasting the cost of rivets, there are some problems of rivet in this conventional way. If the thickness of rivet is not thick enough, the mechanical intensity is quiet weak and it is easy to be deformed in riveting and pressing process. If the thickness of rivet is too thick, it is hard to rivet and clap board tightly. The other problem is that the finished height of riveted rivet is over the height of pre-stacked multiplayer metal circuit board. Owing to this little height difference, the area of pre-stacked multiplayer board near riveted rivets cannot get sufficiently direct pressure and heat to laminate in the lamination process. After this process, there are many of voids inside the board. These defects will affect the performance of board like electricity, thermal reliability and insulation. Moreover, in the size and dimension, the rivet's main body 20b is different each to each. This condition will make alignment of layer to layer run way.

FIGS. 2 and 2A show the conventional manufacturing way of pre-stacked multi-layer metal circuit boards by indirect heating, wherein a plurality of circuit substrates 10a and a plurality of layers of insulating material 11a (e.g., resin) are pressed and heated with hot bar 30a to make them bond together. While this indirect heating way is applied to metal circuit board of more layers, there is large variation of temperature gradient from touched pot of hot bar to middle of pre-stacked more layer board. The outside is high temperature, but the inside is low temperature.

Temperature gradient makes each insulating material 11a in this pre-stacked multi-layer circuit board have different viscosity and degree of bond and hardening. This different viscosity makes layers shift. Whether the heater's temperature and heating time are enough or not will cause difference of degree of bond and hardening. If the temperature of hot bar or bonding time is increased, the inside layer may have a better degree of bond, but the outside layers have been burnt and stripped off. These conditions will greatly affect quality and mechanical strength.

Accordingly, the above conventional pre-stacked multi-layer metal circuit boards have inconvenience and drawbacks in practical use. The present invention aims to resolve the problems in the prior art.

SUMMARY OF THE INVENTION

The primary object of the present invention is to provide a circuit board/printed circuit board having pre-reserved conductive heating circuits, wherein electricity is provided to each layer via a power supply system to heat each layer fast. The time of bond is short, the heat of each layer is uniform, direct and easily controllable, and consumables such as rivets and hot bar are not required. Moreover, the number of heating regions can be increased unlimitedly according to necessity. No matter what the number of layers is, each layer can be heated simultaneously to bond and harden at the same short time, and the bonding strength and hardening is high and uniform. The cost can also be effectively reduced much.

To achieve the above object, the present invention provides a circuit board/printed circuit board having pre-reserved conductive heating circuits, which comprises a plurality of metal circuit substrates and a plurality of layers of insulating material. The conductive heating circuits are pre-reserved at the sides of the metal circuit substrates. The conductive heating circuits are disposed at the regions where the insulating material is to be bonded and sealed. Each of the conductive heating circuits has a plurality of direct heat-generating regions. The insulating material is disposed between the metal circuit substrates. When a power supply system provides currents to the conductive heating circuits, heat required for partly sealing can be generated so that the insulating material and the corresponding positions of the direct heat-generating regions on the metal circuit substrates can be bonded together and hardened.

The various objects and advantages of the present invention will be more readily understood from the following detailed description when read in conjunction with the appended drawing, in which:

DETAILED DESCRIPTION OF THE PREFERRED EMBODIMENTS

Figure 1:
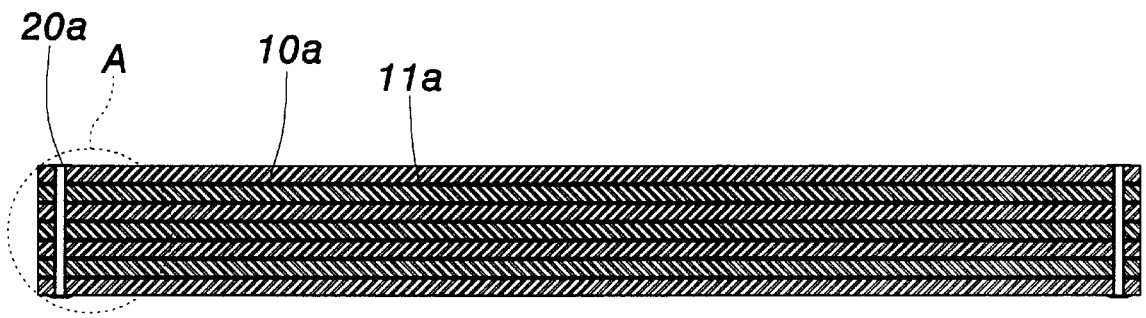
FIG. 1 shows the conventional manufacturing way of pre-stacked multi-layer metal circuit boards by rivet.
Figure 1A:
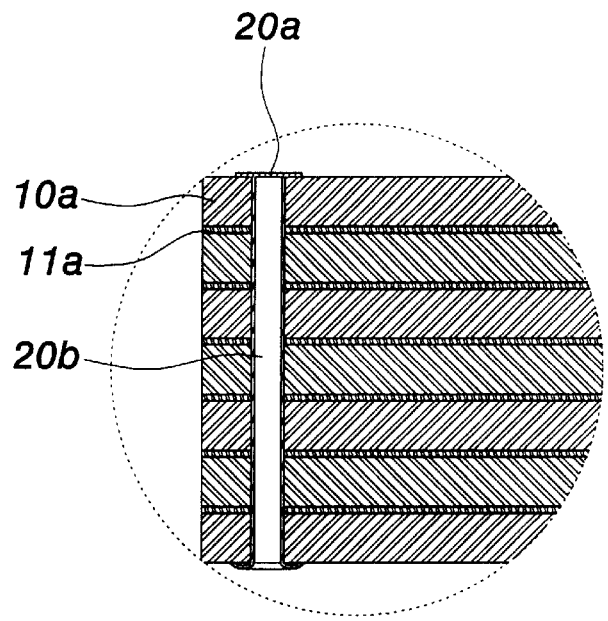
FIG. 1A is a partly enlarged view of part A shown in FIG. 1.
Figure 2:
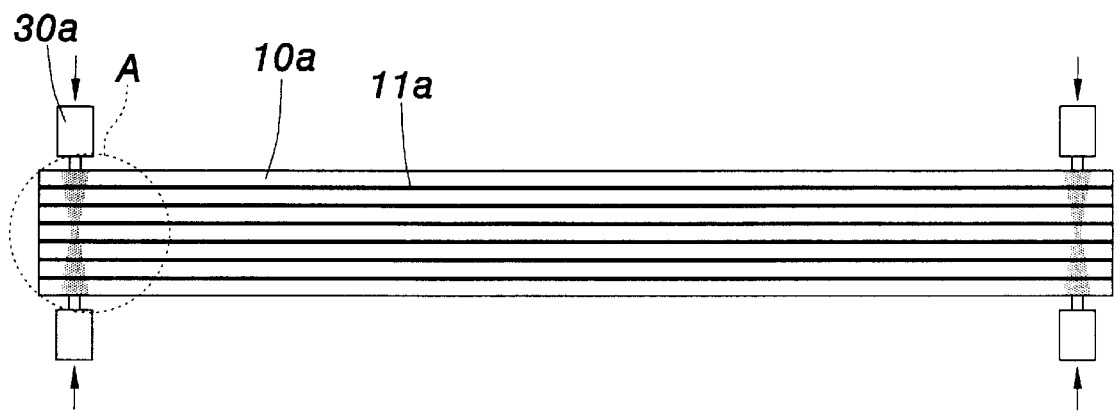
FIG. 2 is a cross-sectional view of a conventional indirect heated multi-layer metal circuit board.
Figure 2A:
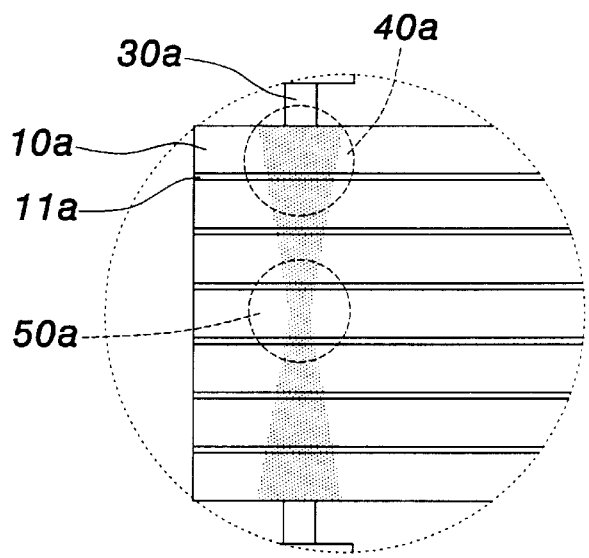
FIG. 2A is a partly enlarged view of part A shown in FIG. 2.
Figure 3:
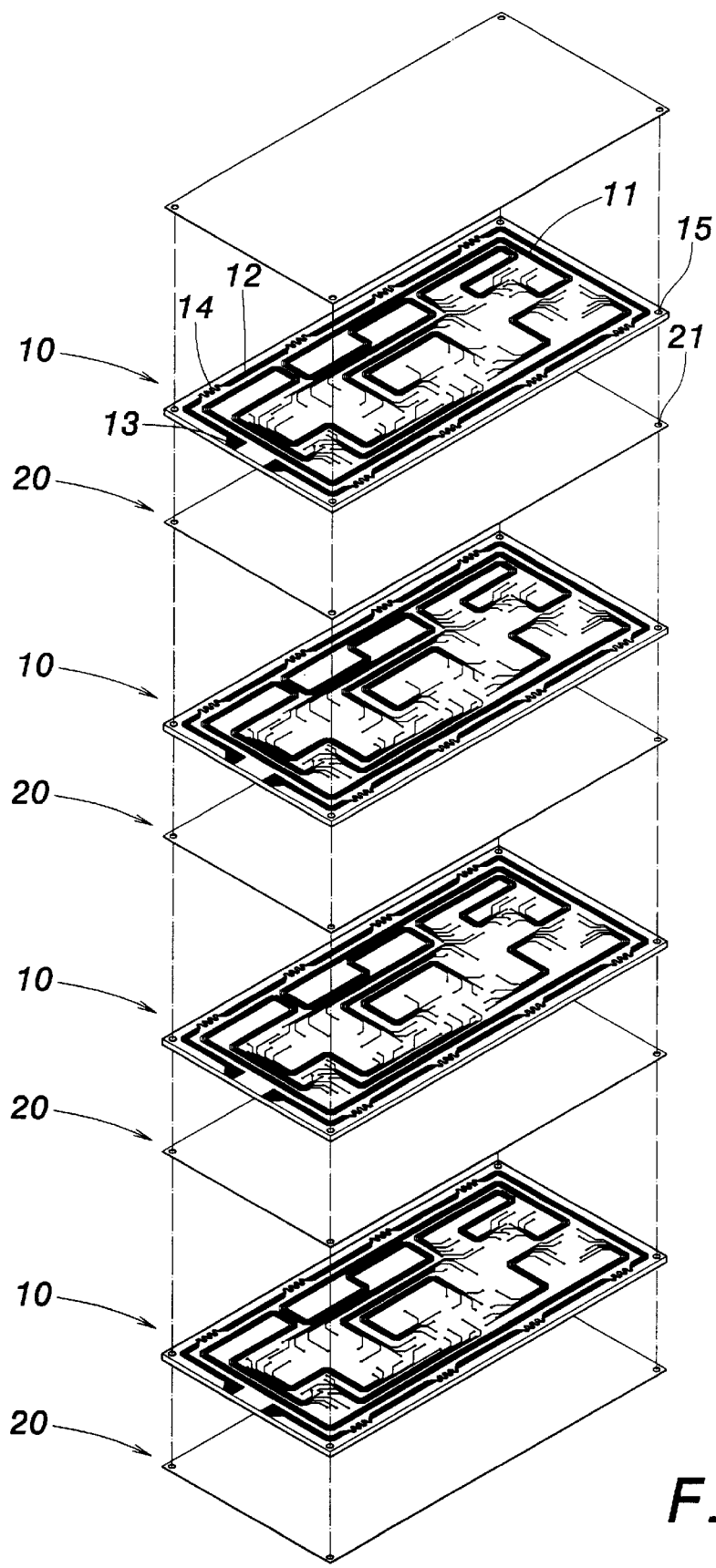
FIG. 3 is an exploded perspective view of the present invention.
Figure 4:
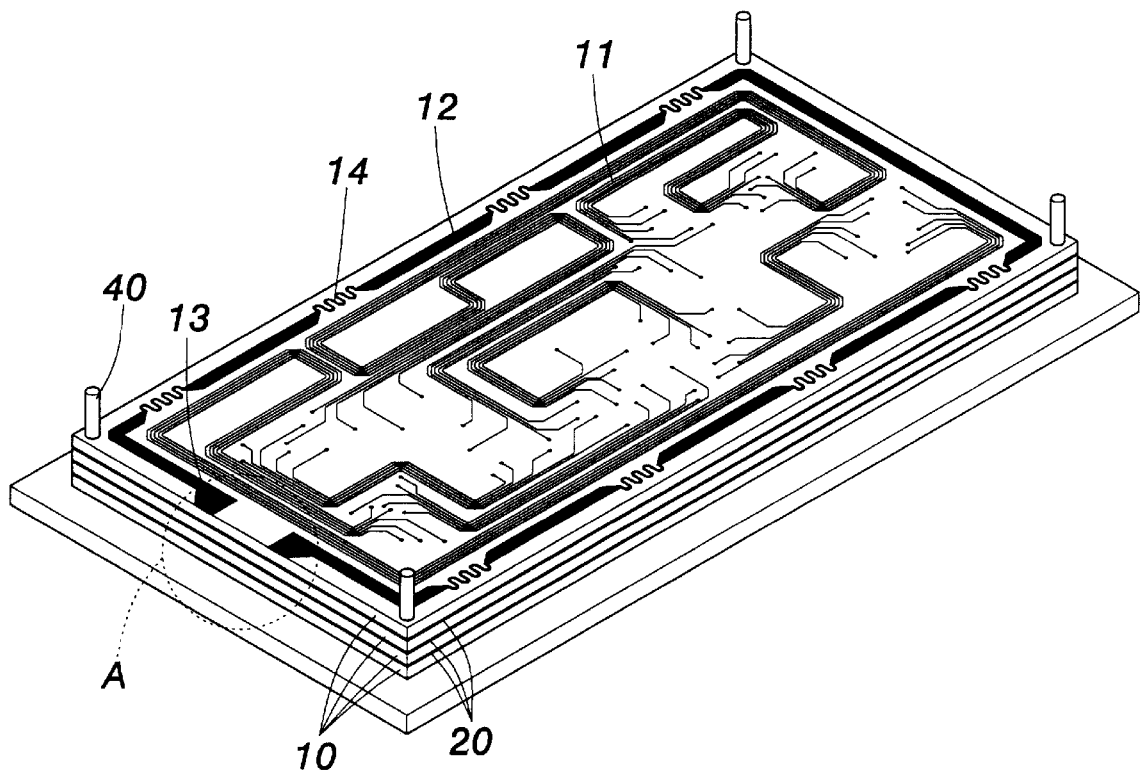
FIG. 4 is a perspective view of the present invention.
Figure 4A:
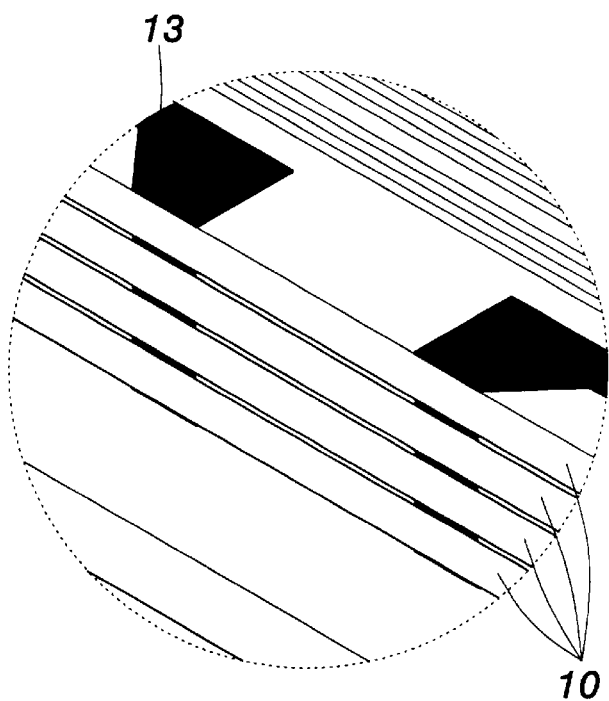
FIG. 4A is a partly enlarged view of part A shown in FIG. 4.

As shown in FIGS. 3, 4, and 4A, the present invention provides a circuit board/printed circuit board having pre-reserved conductive heating circuits, which comprises a plurality of metal circuit substrates 10 and a plurality of layers of insulating material 20 stacked up and down. Appropriate metal circuits 11 are disposed on the metal circuit substrates 10 according to necessity. The insulating material 20 is disposed between the metal circuit substrates 10 to separate them.

In the present invention, conductive heating circuits 12 and direct heat-generating regions 14 are disposed on each of the metal circuit substrates 10. The conductive heating circuits 12 and the direct heat-generating regions 14 are made of conductive material such as metal (e.g., copper, copper alloy, or silver), conductive glue, conductive membrane, or semiconductor. The conductive heating circuits 12 are disposed at the regions where the insulating material 20 is to be bonded and hardened, and are designed to be of patterns, shape, array or structures capable of easily generating heat. The conductive heating circuits 12 and the direct heat-generating regions 14 are disposed on top faces and bottom faces at the sides of the metal circuit substrates 10. The conductive heating circuits 12 and the direct heat-generating regions 14 can also be disposed only on top faces or bottom faces of the metal circuit substrates 10. Each of the conductive heating circuits 12 and the direct heat-generating regions 14 has at least an electrified region 13, which is preferably to be situated at the edge of the metal circuit substrate 10. Each of the conductive heating circuits 12 has a plurality of direct heat-generating regions 14, which are formed by shrinking the width of the circuit. When a power supply system 30 provides a current to the electrified region 13, resistance is generated at the direct heat-generating regions 14. More heat is generated at the positions having larger resistance. Conductive circuits of different widths can thus generate different heat-generating effects. The conductive circuit to generate heat is a load. When the circuit is provided with a current, heat required for partly bonding and hardening is generated. The circuit board/printed circuit board having pre-reserved conductive heating circuits of the present invention is thus formed.

Additionally, appropriate positioning holes 15 and 21 are disposed on the metal circuit substrates 10 and the insulating material 20. In this embodiment of the present invention, the positioning holes 15 and 21 are disposed at four corners on the metal circuit substrates 10 and the insulating material 20 to facilitate passing through of positioning elements 40.

Figure 5:
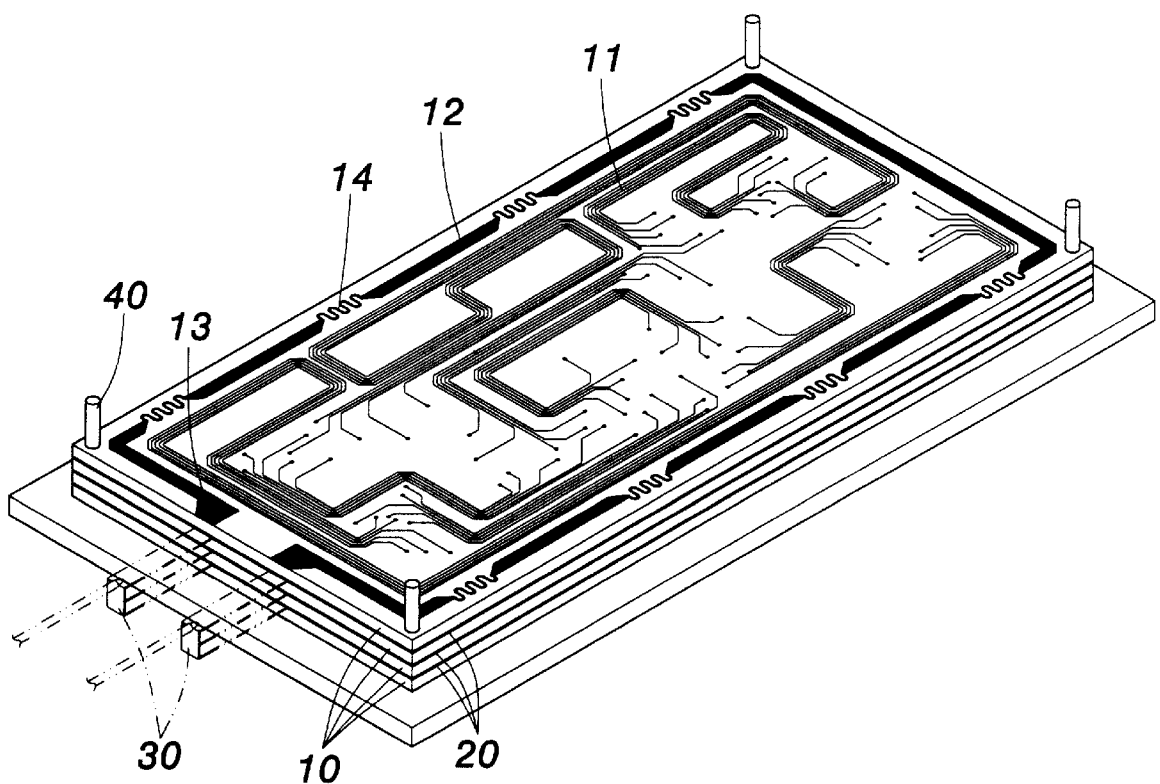
FIG. 5 is a perspective view of the present invention connected to a power supply system.

As shown in FIG. 5, when the metal circuit substrates 10 of the circuit board/printed circuit board of the present invention are to be stacked and processed, it is necessary to pass the positioning elements 40 through the positioning holes 15 and 21 of the metal circuit substrates 10 and the insulating material 20 in advance, and then properly connect the electrified regions 13 of the conductive heating circuits 12 of the metal circuit substrates 10 to the power supply system 30 to provide an appropriate current to the conductive heating circuits 12, thereby generating heat required for bonding and hardening in the circuits. When the current passes the direct heat-generating regions 14, more heat will be generated at the direct heat-generating regions 14. With appropriate pressure applied at the positions to be bonded and hardened, the insulating material 20 and the corresponding regions of the direct heat-generating regions 14 on the metal circuit substrates 10 will be bonded and hardened together through the help of enough heat and temperature.

Figure 6:
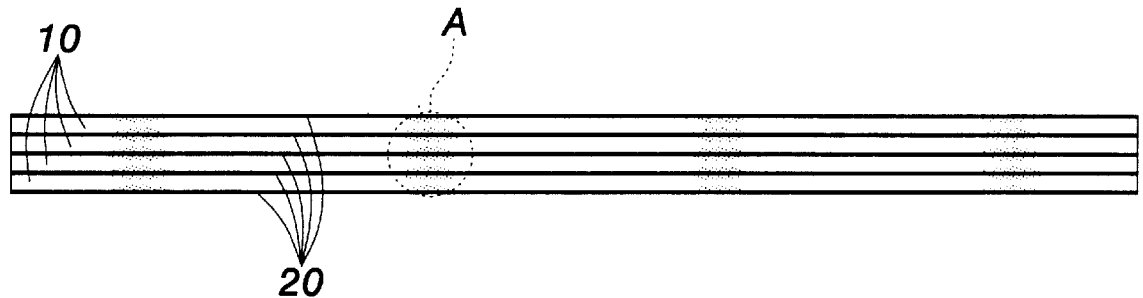
FIG. 6 is a diagram of the present invention showing that bond and hardening has been finished.
Figure 6A:
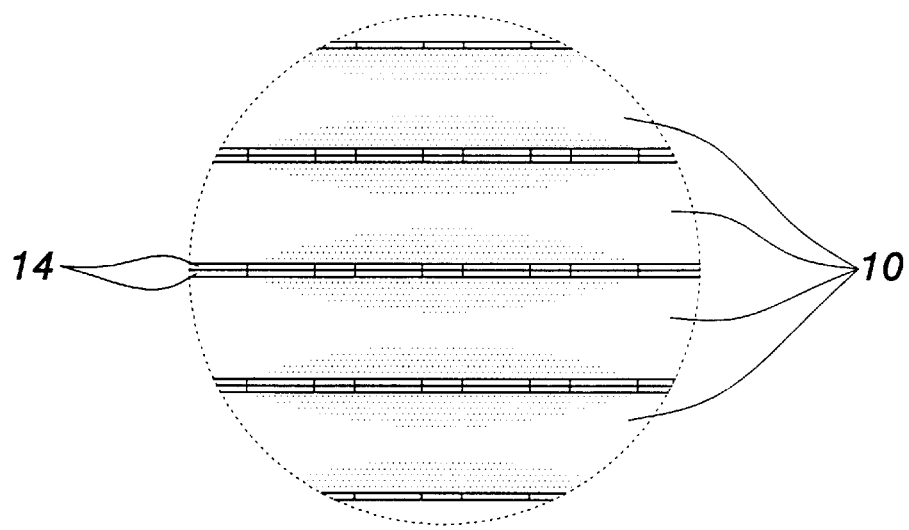
FIG. 6A is a partly enlarged view of part A shown in FIG. 6.

As shown in FIGS. 6 and 6A, the conductive heating circuits 12 and the direct heat-generating regions 14 are disposed on the metal circuit substrates 10. Heat generated by the direct heat-generating regions can thus be uniformly transferred to each of the metal circuit substrates 10. The time of bond and hardening is short, the heating of each layer is fast, uniform, and easily controllable, and consumables such as rivets are not required. Moreover, the number of heating regions can be increased unlimitedly according to necessity. No matter what the number of layers is, each layer can be heated simultaneously to bond and harden, and the bonding strength is high and uniform.

Furthermore, heat generated by the direct heat-generating regions 14 of the conductive heating circuits 12 of the present invention can be fed back to the power supply system 30 for programmable control of current and temperature. Also, in order to obtain the best result, programmable control of pressure can be applied to the portions to be bonded and hardened.

When the present invention is applied to a pre-stacked system of printed circuit board of large number of layers (more than 10), the effect is more conspicuous. Because conductive circuits easily generating heat can be designed at the positions to be partly bonded and hardened on each layer, each layer can generate heat uniformly so that insulating material between layers can be bonded and hardened. In this way of manufacturing printed circuit boards of large number of layers, because each layer has direct heat-generating bodies, the drawbacks of bad bond and hardening, easy ablation, deterioration, burn, slow speed, and high cost occurred in the prior art will not arise.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A circuit board/printed circuit board having pre-reserved conductive heating circuits, comprising:
   a plurality of metal circuit substrates, each having conductive heating circuits disposed thereon, said conductive heating circuits being disposed at regions where insulating material is to be bonded and hardened, each of said conductive heating circuits having a plurality of direct heat-generating regions; and
   a plurality of layers of insulating material disposed between said metal circuit substrates;
   whereby heat required for partly bonding and hardening can be generated so that said insulating material and corresponding positions of said direct heat-generating regions on said metal circuit substrates can be bonded and hardened together through the help of enough heat and temperature when a current is provided to said conductive heating circuits.

2. The circuit board/printed circuit board having pre-reserved conductive heating circuits as claimed in claim 1, wherein appropriate metal circuits are disposed on said metal circuit substrates.

3. The circuit board/printed circuit board having pre-reserved conductive heating circuits as claimed in claim 1, wherein positioning holes are disposed on said metal circuit substrates and said insulating material to facilitate passing through of positioning elements.

4. The circuit board/printed circuit board having pre-reserved conductive heating circuits as claimed in claim 1, wherein said conductive heating circuits are disposed on top faces and/or bottom faces of said metal circuit substrates.

5. The circuit board/printed circuit board having pre-reserved conductive heating circuits as claimed in claim 1, wherein each of said conductive heating circuits has an electrified region.

6. The circuit board/printed circuit board having pre-reserved conductive heating circuits as claimed in claim 5, wherein said electrified region is at an edge of each of said metal circuit substrates.

7. The circuit board/printed circuit board having pre-reserved conductive heating circuits as claimed in claim 5, wherein said electrified regions are connected to a power supply system.

8. The circuit board/printed circuit board having pre-reserved conductive heating circuits as claimed in claim 1, wherein said direct heat-generating regions are formed by shrinking width, pattern, and shape of circuits.

* * * * *